(12) United States Patent
Huang et al.

(10) Patent No.: US 10,115,690 B2
(45) Date of Patent: Oct. 30, 2018

(54) METHOD OF MANUFACTURING MICRO PINS AND ISOLATED CONDUCTIVE MICRO PIN

(71) Applicant: TAIWAN SEMICONDUCTOR MANUFACTURING CO., LTD., Hsinchu (TW)

(72) Inventors: Ying-Jui Huang, Zhubei (TW); Chung-Shi Liu, Hsinchu (TW); Hsin-Hung Liao, Taipei (TW); Chien-Ling Hwang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 218 days.

(21) Appl. No.: 14/632,654

(22) Filed: Feb. 26, 2015

(65) Prior Publication Data
US 2016/0254239 A1 Sep. 1, 2016

(51) Int. Cl.
*H01L 23/00* (2006.01)
*C25D 1/22* (2006.01)
*C25D 1/00* (2006.01)

(52) U.S. Cl.
CPC .............. *H01L 24/11* (2013.01); *C25D 1/00* (2013.01); *C25D 1/22* (2013.01); *H01L 24/13* (2013.01); *H01L 2224/11001* (2013.01); *H01L 2224/1111* (2013.01); *H01L 2224/11462* (2013.01); *H01L 2224/11622* (2013.01); *H01L 2224/13013* (2013.01); *H01L 2224/13017* (2013.01); *H01L 2924/2064* (2013.01)

(58) Field of Classification Search
CPC .. C25D 1/20; C25D 1/22; H01L 24/12; H01L 24/24; H01L 2924/2064; H01L 2224/13017; H01L 2224/11001; H01L 2224/11462; H01L 2224/13013; H01L 2224/11622; H01L 2224/1111
See application file for complete search history.

(56) References Cited

U.S. PATENT DOCUMENTS

| | | | | |
|---|---|---|---|---|
| 6,268,015 B1* | 7/2001 | Mathieu | ............ | G01R 1/06727 427/272 |
| 2006/0108678 A1* | 5/2006 | Kumar | ............... | B23K 35/0222 257/690 |
| 2006/0219567 A1* | 10/2006 | Hu | ......................... | C25D 5/022 205/125 |
| 2010/0116676 A1* | 5/2010 | Kim | ......................... | C25D 1/00 205/122 |
| 2011/0233063 A1* | 9/2011 | Seki | ....................... | C25D 5/022 205/70 |

* cited by examiner

*Primary Examiner* — Louis J Rufo
(74) *Attorney, Agent, or Firm* — Maschoff Brennan

(57) ABSTRACT

A method of manufacturing micro pins includes forming a release layer over a substrate. A pattern layer is formed over the release layer, in which the pattern layer has a plurality of openings spaced apart to each other and through the pattern layer. A plurality of micro pins are respectively formed in the openings. The pattern layer and the release layer are removed to obtain the micro pins. An isolated conductive micro pin for connecting one or more components is also provided.

20 Claims, 8 Drawing Sheets

METHOD OF MANUFACTURING MICRO PINS AND ISOLATED CONDUCTIVE MICRO PIN

BACKGROUND

Bonded wires and solder bumps are common microstructures formed on micro devices, which are usually fabricated on silicon wafers. Wire bonding is the earliest technique for interconnecting electronic devices. However, many potential issues exist in the bonded wires, for example, weak bond and heel crack.

PoP technology is an important development for the microelectronic industry. PoP packaging using the solder bump with a large size has excellent yield. As the pitch of solder bumps in PoP packaging decreases, it may result in high bridge risk. In addition, the solder bump may be collapse during reflow soldering. Accordingly, there is a need to provide an alternative interconnect structure to address the problems mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
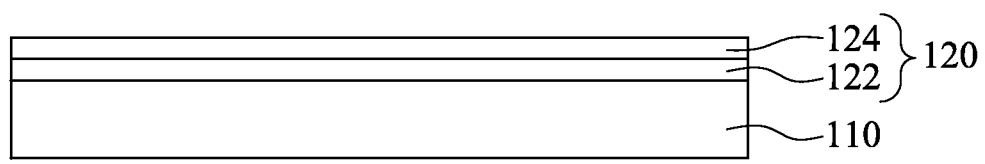
FIGS. 1A-1E are cross-sectional views at various stages of manufacturing micro pins in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, there are still some problems associated with use of the bonded wires and the solder bumps. Therefore, a micro pin is provided, which will not collapse during reflow soldering. However, existing micro pins are not small enough to be used in smaller technology nodes. Specifically, in general, the micro pins are formed by cutting a cylindrical metal wire. For example, the cylindrical metal wire is transferred into and clamped by a mold, and a portion of the mold is then moved along a direction perpendicular or substantially perpendicular to a longitudinal axis of the cylindrical metal wire to cut the cylindrical metal wire, and thus to obtain the cylindrical micro pin. Nevertheless, it is difficult to fabricate a micro pin with a very short line length (e.g., lower than or equal to 100 μm), very narrow line width (e.g., lower than or equal to 80 μm)) or a specific aspect ratio (e.g., a ratio of the line length to the line width is lower than or equal to 1) due to the limit of the mold (e.g., mold tolerance). It is also difficult to fabricate a micro pin with an irregular shape. In addition, the cut position of the mold and its periphery may be easily damaged due to abrasion with the cylindrical metal wire, and thus should be repaired regularly. The incision of the micro pin may be uneven accordingly.

In view of the foregoing, the present disclosure provides a method of manufacturing micro pins with a very small size, a specific aspect ratio, an irregular shape or a combination thereof. Various embodiments of the method of manufacturing the micro pins will be described below in detail.

FIGS. 1A-1E are cross-sectional views at various stages of manufacturing micro pins in accordance with some embodiments of the present disclosure. As shown in FIG. 1A, a substrate 110 is provided. The substrate 110 is configured to support the release layer 120. In some embodiments, there is no use of the substrate 110. In some embodiments, the substrate 110 is a semiconductor substrate, a ceramic substrate, a plastic substrate or a combination thereof. In some embodiments, the substrate 110 possesses good anti-corrosion property. In some embodiments, the substrate 110 includes an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof.

The release layer 120 is then formed over the substrate 110. The release layer 120 will be removed in the following step. In some embodiments, the release layer 120 is formed using any process, such as a physical vapor deposition (PVD) process, a chemical vapor deposition (CVD) process (e.g., plasma enhanced CVD (PECVD), low pressure CVD (LPCVD) or high density plasma CVD (HDPCVD)), an atomic layer deposition (ALD) process, a plating process, a coating process or any other suitable formation process.

In some embodiments, the release layer 120 is conductive. In some embodiments, the release layer 120 includes metal, metal compound, alloy or a combination thereof. In some embodiments, the release layer 120 includes Au, Al, Pt, Cu, Ti, Cr or a combination thereof. In some embodiments, the release layer 120 includes Au, Al, Pt, Cu, Ti and Au, Cr and Au, Ti and Al, Cr and Al, Ti and Pt, Cr and Pt, Ti and Cu, or Cr and Cu.

In some embodiments, the release layer 120 includes an adhesion layer 122 over the substrate 110 and a conductive layer 124 over the adhesion layer 122, as shown in FIG. 1A. The adhesion layer 122 is configured to provide good adhesion between the substrate 110 and the conductive layer 124. In some embodiments, the adhesion layer 122 is formed over the substrate 110, and the conductive layer 124 is then formed over the adhesion layer 122. In some embodiments, the adhesion layer 122 and the conductive layer 124 are formed using any process, such as a CVD process, a PVD process, an ALD process, a plating process, a coating process or another formation process. In some embodiments, the adhesion layer 122 includes Cr, Ti or a combination thereof. In some embodiments, the conductive layer 124 exhibits excellent conductivity. In some embodiments, the conductive layer 124 includes Au, Al, Pt, Cu or a combination thereof.

Figure 1B:
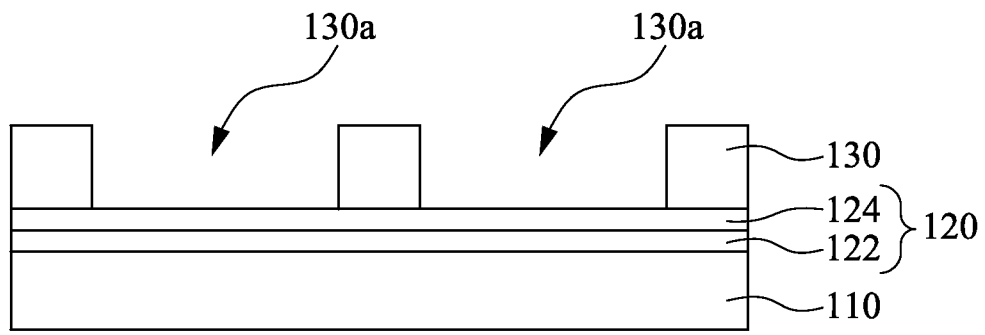

As shown in FIG. 1B, a pattern layer 130 is formed over the release layer 120. In some embodiments, the pattern layer 130 is formed by a printing, or a film formation process and a material removal process. In some embodiments, the pattern layer 130 is formed by the printing, such as imprinting, screen printing, ink jet printing or any other suitable printing process. In some embodiments, the pattern layer 130 is formed by the film formation process and the material removal process. In some embodiments, the film formation process includes a CVD process, a PVD process, an ALD process, a plating process, a coating process, a laminating process or another formation process. In some embodiments, the coating process includes spin coating, slot coating, extrusion coating, curtain coating, slide coating, dipping, doctor blade coating or a combination thereof. In some embodiments, the material removal process includes photolithography and/or etching process, a laser drilling process or any other suitable material removal process.

In some embodiments, forming the pattern layer 130 over the release layer 120 includes performing a photolithographic process due to its high resolution, high sensitivity, high alignment accuracy and low defect density. In some embodiments, the pattern layer 130 includes photoresist, such as positive photoresist or negative photoresist. In some embodiments, the photoresist includes organic materials, such as a photosensitive polymer.

It is worth noting that, the pattern layer 130 has a plurality of openings 130a spaced apart to each other and through the pattern layer 130. Each of the openings 130a is configured to accommodate a micro pin formed in the following step. The opening 130 can have any geometrical configuration. The dimension of the opening 130 determines the dimension of the micro pin.

Figure 1C:
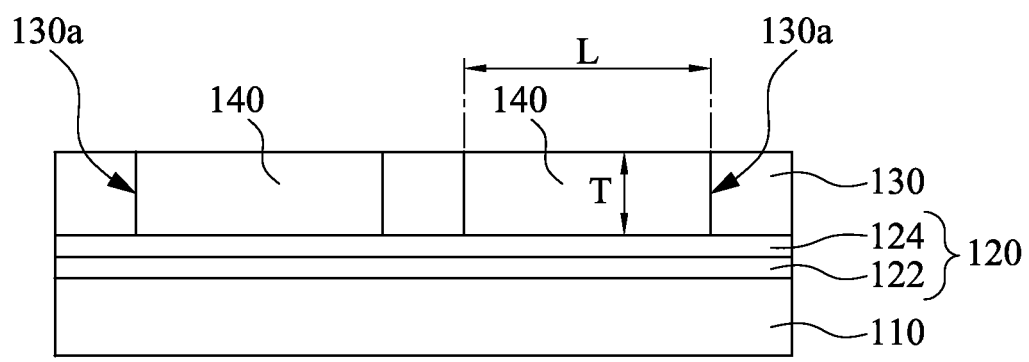

Next, as shown in FIG. 1C, a plurality of micro pins 140 are respectively formed in the openings 130. In some embodiments, the micro pins 140 are formed using a CVD process, a PVD process, an ALD process, a plating process, a coating process or another formation process. In some embodiments, the plating process includes electroplating, chemical plating or a combination thereof. In some embodiments, each of the micro pins 140 has an upper surface (not marked) which is coplanar with an upper surface (not marked) of the pattern layer 130, as shown in FIG. 1C. In other embodiments, the upper surface of the micro pin 140 may also be lower or slightly higher than the upper surface of the pattern layer 130.

In some embodiments, forming the plurality of micro pins 140 respectively in the openings 130a is conducted by performing the electroplating process. In some embodiments, the release layer 120 is conductive and configured to act as an electrode when the electroplating process for forming the micro pins 140 is performed. In some embodiments, the conductive layer 124 of the release layer 120 is configured to act as an electrode when the electroplating process for forming the micro pins 140 is performed.

Figure 2:
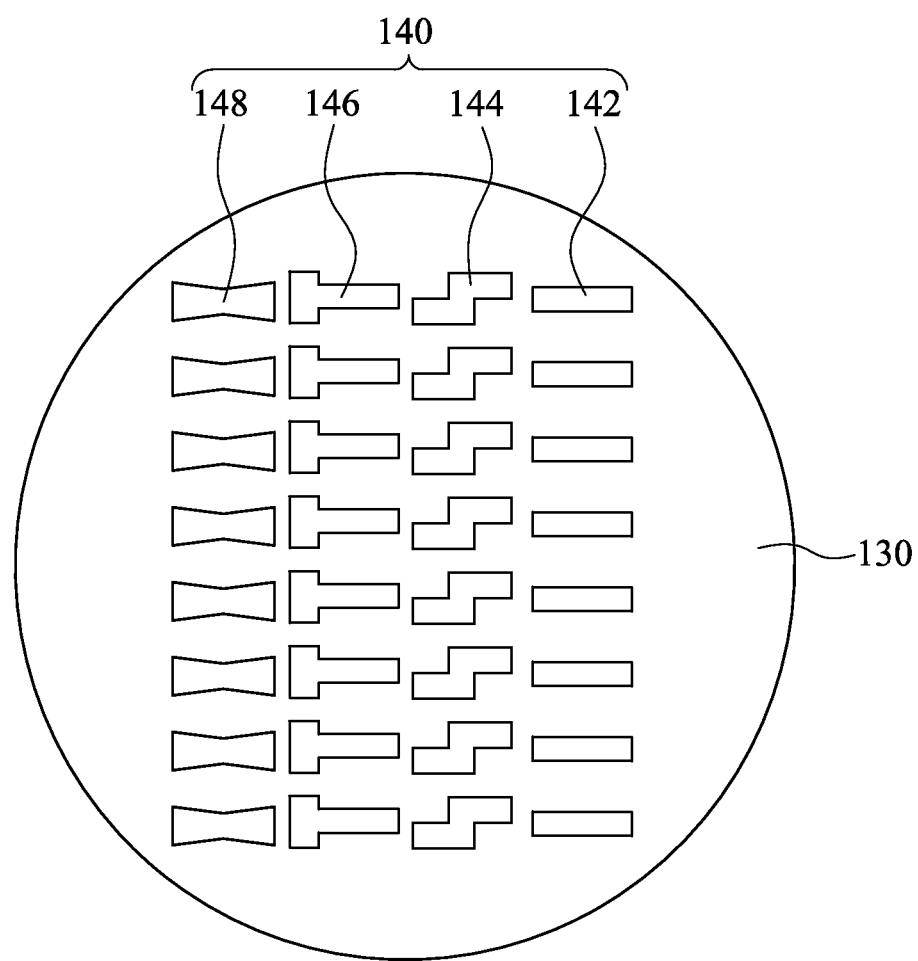
FIG. 2 is a top view at a stage of manufacturing micro pins in accordance with some embodiments of the present disclosure.

FIG. 2 is a top view at a stage of manufacturing micro pins in accordance with some embodiments of the present disclosure. As shown in FIG. 2, the micro pins 140 have a variety of shapes surrounded by the pattern layer 130. In some embodiments, the micro pin 142 is long straight shaped. In some embodiments, the micro pin 144 is lightning-shaped. In some embodiments, the micro pin 146 is T-shaped. In some embodiments, the micro pin 148 is hourglass-shaped. In other embodiments, the micro pin is I-shaped, dumbbell-shaped or has any other suitable shape in accordance with the requirements.

It is noteworthy that, the openings 130 formed using a process with high resolution (e.g., photolithography process) can have fine feature size (e.g., a very small size, a specific aspect ratio, an irregular shape or a combination thereof), such that the micro pin 140 can have the same or substantially the same fine feature size and thus able to be employed in smaller technology nodes. Specifically, in some embodiments, as shown in FIG. 1C, the micro pin 140, in a top view, has a length L lower than or equal to 500 µm. In some embodiments, the length L of the micro pin 140 is lower than or equal to 100 µm. The term "length L" refers to the longest dimension of the micro pin 140. In some embodiments, the micro pin 140, in a top view, has a width (not shown in FIG. 1C) lower than or equal to 300 µm. In some embodiments, the width of the micro pin 140 is lower than or equal to 80 µm. The term "width" refers to the next longest dimension of the micro pin 140. In some embodiments, the micro pin 140 has a thickness T lower than or equal to 300 µm. In some embodiments, the thickness T of the micro pin 140 is lower than or equal to 80 µm.

Figure 1D:
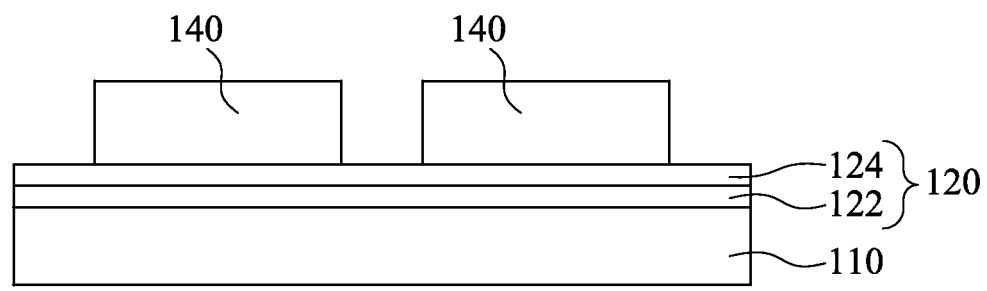

Subsequently, as shown in FIGS. 1C and 1D, the pattern layer 130 of FIG. 1C is removed. In some embodiments, the pattern layer 130 is removed by selectively etching, such as wet etching or dry etching. In some embodiments, an ashing process using oxygen plasma or the like is performed to remove the pattern layer 130. Regardless of the method used, the selectivity between the pattern layer 130 and the micro pins 140 should be high.

Figure 1E:
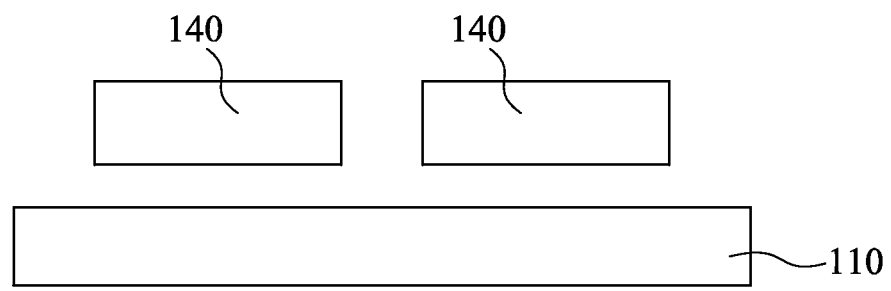

As shown in FIGS. 1D and 1E, the release layer 120 of FIG. 1D is removed, and thus to obtain the micro pins 140. In some embodiments, the release layer 120 is removed by selectively etching, such as wet etching or dry etching. Regardless of the method used, the selectivity between the release layer 120 and the micro pins 140 should be high. Therefore, in some embodiments, each of the micro pins 140 includes a metallic element different from a metallic element of the release layer 120. In some embodiments, each of the micro pins 140 includes a metallic element different from a metallic element of the conductive layer 124 and a metallic element of the adhesion layer 122. In some embodiments, the micro pins 140 include copper. In some embodiments, the release layer 120 excludes copper. In some embodiments, the adhesion layer 122 and the conductive layer 124 exclude copper.

In some embodiments, removing the release layer 120 includes removing the adhesion layer 122 to separate the conductive layer 124 and the micro pins 140 over the conductive layer 124 from the substrate 110, and then removing the conductive layer 124 to obtain the micro pins 140. In some embodiments, removing the release layer 120 includes removing the conductive layer 124 to separate the micro pins 140 from the adhesive layer 122, which is on substrate 110, and then obtain the micro pins 140.

In some embodiments, the adhesion layer 122 includes Cr, Ti or a combination thereof. In some embodiments, the adhesion layer 122 including Cr is removed by wet etching in a solution including ceric ammonium nitrate or any other suitable chemical. In some embodiments, the adhesion layer 122 including Ti is removed by wet etching in a solution including hydrofluoric acid or any other suitable chemical.

In some embodiments, the conductive layer 124 includes Au, Cu, Al, Pt or a combination thereof. In some embodiments, the conductive layer 124 including Au is removed by wet etching in a solution including potassium iodide-iodine or any other suitable chemical. In some embodiments, the conductive layer 124 including Cu is removed by wet etching in a solution including ferric chloride or any other suitable chemical. In some embodiments, the conductive layer 124 including Al is removed by wet etching in a solution including hydrochloric acid or any other suitable chemical. In some embodiments, the conductive layer 124 including Pt is removed by wet etching in a solution including Aqua Regia or any other suitable chemical.

In other embodiments, the pattern layer 130 and the release layer 120 are removed by performing a process to reduce the number of processing step, shorten the processing time and reduce production cost.

Figure 3A:
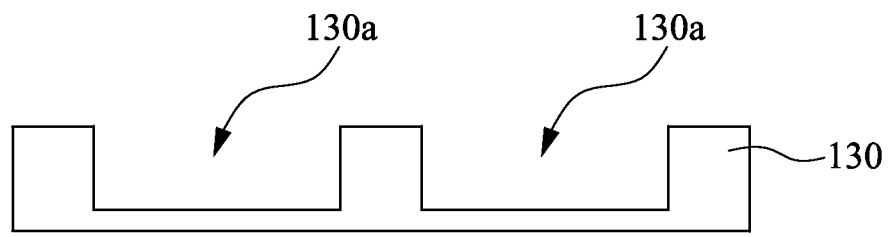
FIGS. 3A-3C are cross-sectional views at various stages of manufacturing micro pins in accordance with some embodiments of the present disclosure.
Figure 3B:
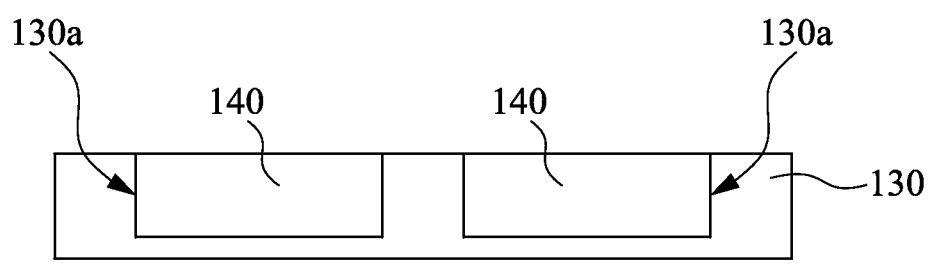
Figure 3C:
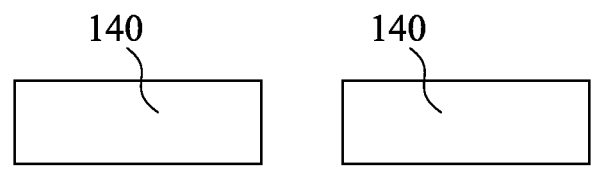

FIGS. 3A-3C are cross-sectional views at various stages of manufacturing micro pins in accordance with some embodiments of the present disclosure. As shown in FIG. 3A, a pattern layer 130 is formed, in which the pattern layer 130 has a plurality of openings 130a spaced apart to each other and not through the pattern layer 130. In some embodiments, a thick layer (not shown) is provided, and a patterning process is performed on the thick layer to form the pattern layer 130. In some embodiments, the patterning process includes a printing, or a film formation process and a material removal process. In some embodiments, the pattern layer 130 is conductive. In some embodiments, the pattern layer 130 includes Au, Cu, Al, Pt or a combination thereof.

Next, as shown in FIG. 3B, a plurality of micro pins 140 are respectively formed in the openings 130a. In some embodiments, the micro pins 140 are formed using a CVD process, a PVD process, an ALD process, a plating process, a coating process or another formation process. In some embodiments, forming the plurality of micro pins 140 is conducted by performing the electroplating process. In other embodiments, to effectively form the micro pins 140 by the electroplating process, a conductive layer (not shown) with excellent conductivity is formed covering a bottom surface (not marked) of the openings 130a before the micro pins 140 are formed. In some embodiments, the conductive layer includes Au, Cu, Al, Pt or a combination thereof.

As shown in FIGS. 3B and 3C, the pattern layer 130 of FIG. 3B is removed to obtain the micro pins 140. In some embodiments, the pattern layer 130 is removed by selectively etching, such as wet etching or dry etching. Regardless of the method used, the selectivity between the pattern layer 130 and the micro pins 140 should be high. Therefore, in some embodiments, each of the micro pins 140 includes a metallic element different from a metallic element of the pattern layer 130.

The present disclosure also provides an isolated conductive micro pin for connecting one or more components. In some embodiments, the isolated conductive micro pin is fixed on the one or more components using an adhesive or through solder welding or eutectic bonding. In some embodiments, the isolated conductive micro pin is manufactured by the method of the present disclosure. It is worth noting that, the isolated conductive micro pin may be applied in various fields, such as semiconductor industry or detection (e.g., biomedical detection). In some embodiments, the isolated conductive micro pin is acted as an interconnect structure in a semiconductor package structure. In some embodiments, the semiconductor package structure includes a die or a chip. In some embodiments, the isolated conductive micro pin is acted as an interconnect structure in a Micro-Electro-Mechanical Systems (MEMS). In some embodiments, the isolated conductive micro pin is acted as a pinhead in detection equipment.

Figure 4A:
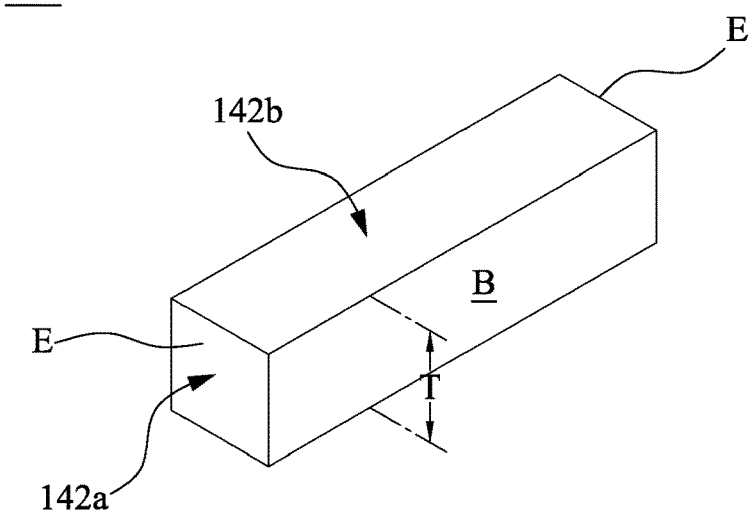
FIG. 4A is a schematic drawing of an isolated conductive micro pin in accordance with some embodiments of the present disclosure.

FIG. 4A is a schematic drawing of an isolated conductive micro pin 142 in accordance with some embodiments of the present disclosure. The micro pin 142 has a body B with a fixed or substantially fixed thickness T. The body B has two ends E, and each of the ends E has a quadrangular surface 142a. The term "quadrangular" refers to a perfect quadrangular shape with four angled corners. In some embodiments, the quadrangular surface 142a is a rectangular surface. The term "rectangular" refers to a perfect rectangular shape with four right-angled corners. In some embodiments, the quadrangular surface 142a is a square surface. The term "square" refers to a perfect square shape with four right-angled corners. In some embodiments, the body B is long straight shaped. In some embodiments, the body B has a long straight shaped surface 142b perpendicular or substantially perpendicular to the quadrangular surface 142a of each of the ends E. In some embodiments, the thickness T is less than or equal to 300 μm. In some embodiments, the thickness T is less than or equal to 80 μm.

Figure 4B:
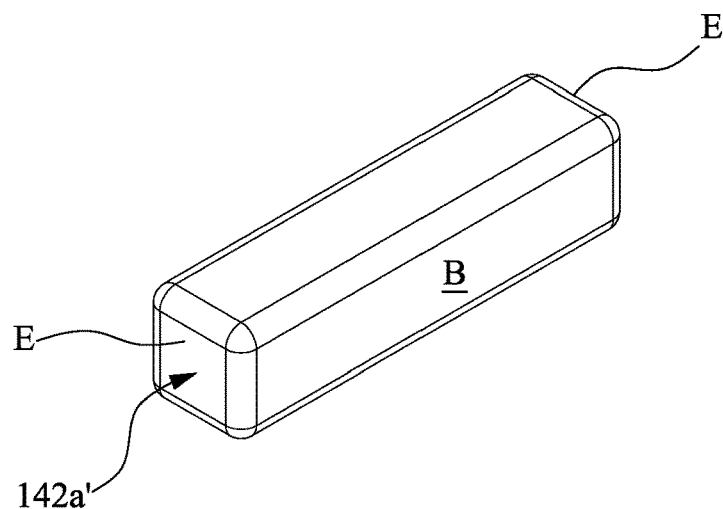
FIG. 4B is a schematic drawing of an isolated conductive micro pin after a ball mill process is performed on the isolated conductive micro pin of FIG. 4A in accordance with some embodiments of the present disclosure.

FIG. 4B is a schematic drawing of an isolated conductive micro pin 142' after a ball mill process is performed on the isolated conductive micro pin 142 of FIG. 4A in accordance with some embodiments of the present disclosure. As shown in FIG. 4B, the body B of the micro pin 142' has two ends E, and each of the ends E has a substantially quadrangular surface 142a'. The term "substantially quadrangular" refers to a quadrangular shape with slightly rounded or tapered corners. More specifically, the substantially quadrangular surface 142a' includes four straight edges and four arc edges, and two of the four straight sides adjacent to each other are connected through one of the four arc edges. In some embodiments, the substantially quadrangular surface 142a' is a substantially rectangular surface. The term "substantially rectangular" refers to a rectangular shape with slightly rounded or tapered corners. In some embodiments, the substantially quadrangular surface 142a' is a substantially square surface. The term "substantially square" refers to a square shape with slightly rounded or tapered corners.

Figure 5A:
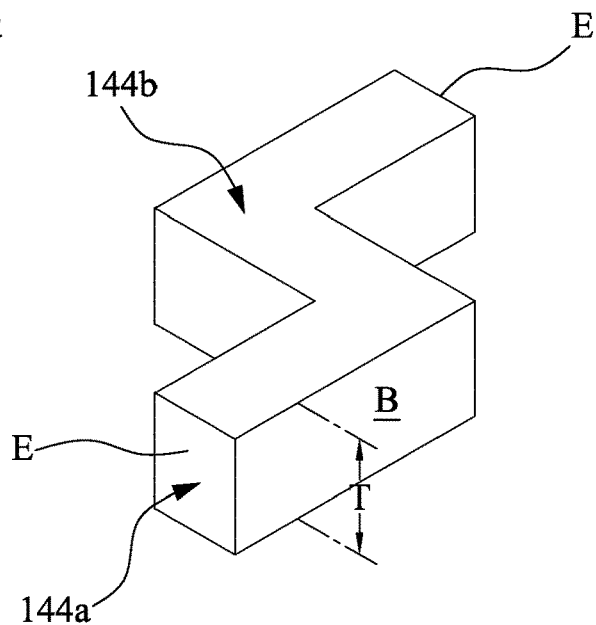
FIG. 5A is a schematic drawing of an isolated conductive micro pin in accordance with some embodiments of the present disclosure.

FIG. 5A is a schematic drawing of an isolated conductive micro pin 144 in accordance with some embodiments of the present disclosure. The micro pin 144 has a body B with a fixed or substantially fixed thickness T. The body B has two ends E, and each of the ends E has a quadrangular surface 144a. In some embodiments, the quadrangular surface 144a is a rectangular surface. In some embodiments, the quadrangular surface 144a is a square surface. In some embodiments, the body B is lightning-shaped. In some embodiments, the body B has a lightning-shaped surface 144b perpendicular or substantially perpendicular to the quadrangular surface 144a of each of the ends E. In some embodiments, the ends E have the same areas or different areas. In some embodiments, the micro pin 144 is configured to interconnect two components which are misaligned to each other.

Figure 5B:
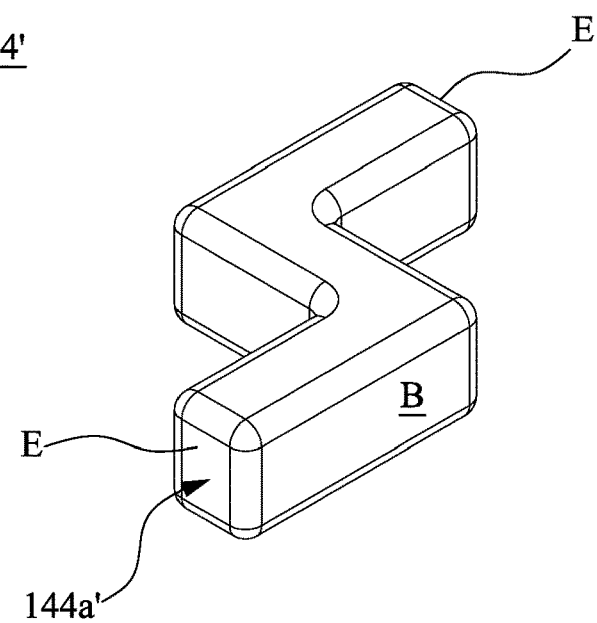
FIG. 5B is a schematic drawing of an isolated conductive micro pin after a ball mill process is performed on the isolated conductive micro pin of FIG. 5A in accordance with some embodiments of the present disclosure.

FIG. 5B is a schematic drawing of an isolated conductive micro pin 144' after a ball mill process is performed on the isolated conductive micro pin 144 of FIG. 5A in accordance with some embodiments of the present disclosure. As shown in FIG. 5B, the body B of the micro pin 144' has two ends E, and each of the ends E has a substantially quadrangular surface 144a'. In some embodiments, the substantially quadrangular surface 144a' is a substantially rectangular surface. In some embodiments, the substantially quadrangular surface 144a' is a substantially square surface.

Figure 6A:
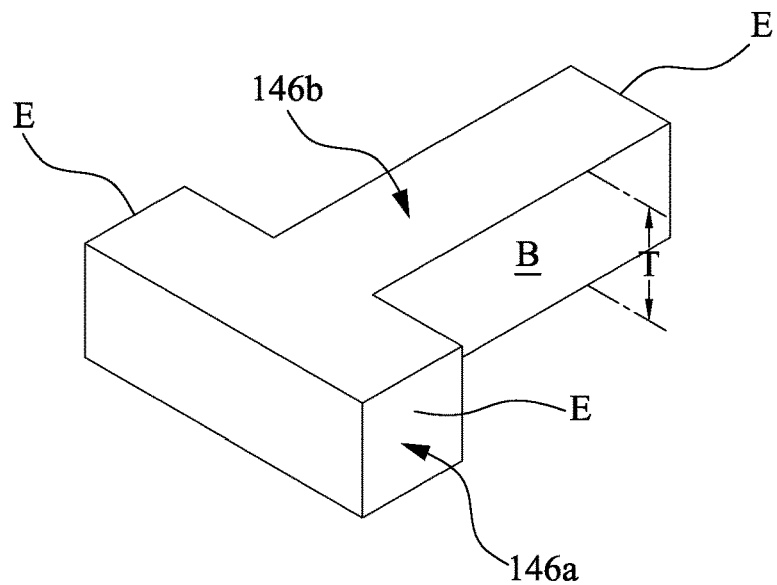
FIG. 6A is a schematic drawing of an isolated conductive micro pin in accordance with some embodiments of the present disclosure.

FIG. 6A is a schematic drawing of an isolated conductive micro pin 146 in accordance with some embodiments of the present disclosure. The micro pin 146 has a body B with a fixed or substantially fixed thickness T. The body B has three ends E, and each of the ends E has a quadrangular surface 146a. In some embodiments, the quadrangular surface 146a is a rectangular surface. In some embodiments, the quadrangular surface 146a is a square surface. In some embodiments, the body B is T-shaped. In some embodiments, the body B has a T-shaped surface 146b perpendicular or substantially perpendicular to the quadrangular surface 146a of each of the ends E. In some embodiments, the ends E have the same areas or different areas. In some embodiments, the micro pin 146 is configured to interconnect two or three components.

Figure 6B:
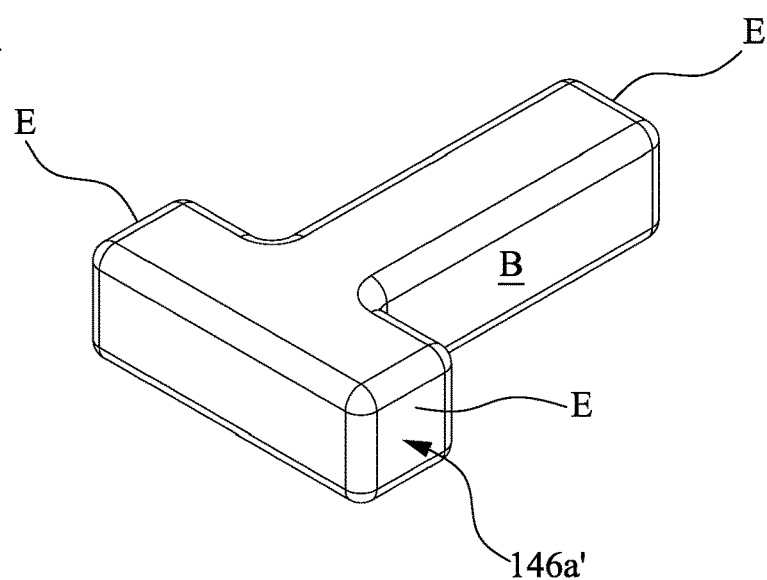
FIG. 6B is a schematic drawing of an isolated conductive micro pin after a ball mill process is performed on the isolated conductive micro pin of FIG. 6A in accordance with some embodiments of the present disclosure.

FIG. 6B is a schematic drawing of an isolated conductive micro pin 146' after a ball mill process is performed on the isolated conductive micro pin 146 of FIG. 6A in accordance with some embodiments of the present disclosure. As shown in FIG. 6B, the body B of the micro pin 146' has three ends E, and each of the ends E has a substantially quadrangular surface 146a'. In some embodiments, the substantially quadrangular surface 146a' is a substantially rectangular surface. In some embodiments, the substantially quadrangular surface 146a' is a substantially square surface.

Figure 7A:
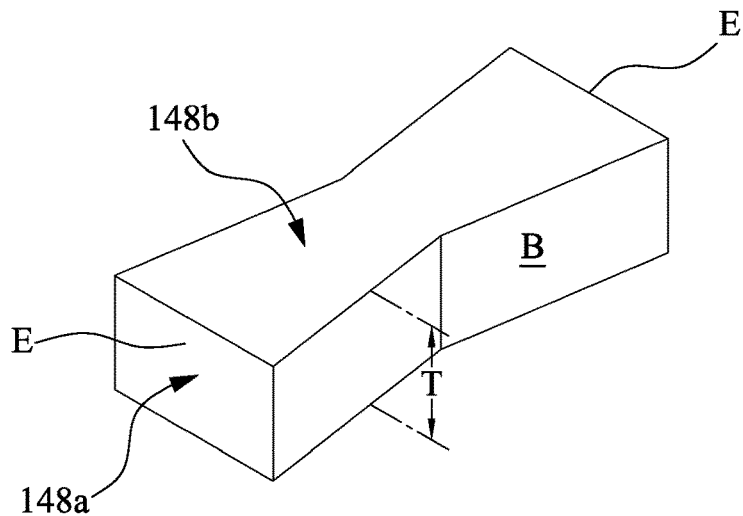
FIG. 7A is a schematic drawing of an isolated conductive micro pin in accordance with some embodiments of the present disclosure.

FIG. 7A is a schematic drawing of an isolated conductive micro pin 148 in accordance with some embodiments of the present disclosure. The micro pin 148 has a body B with a fixed or substantially fixed thickness T. The body B has two ends E, and each of the ends E has a quadrangular surface 148a. In some embodiments, the quadrangular surface 148a is a rectangular surface. In some embodiments, the quadrangular surface 148a is a square surface. In some embodiments, the body B is hourglass-shaped. In some embodiments, the body B has an hourglass-shaped surface 148b perpendicular or substantially perpendicular to the quadrangular surface 148a of each of the ends E. In some embodiments, the ends E have the same areas or different areas.

Figure 7B:
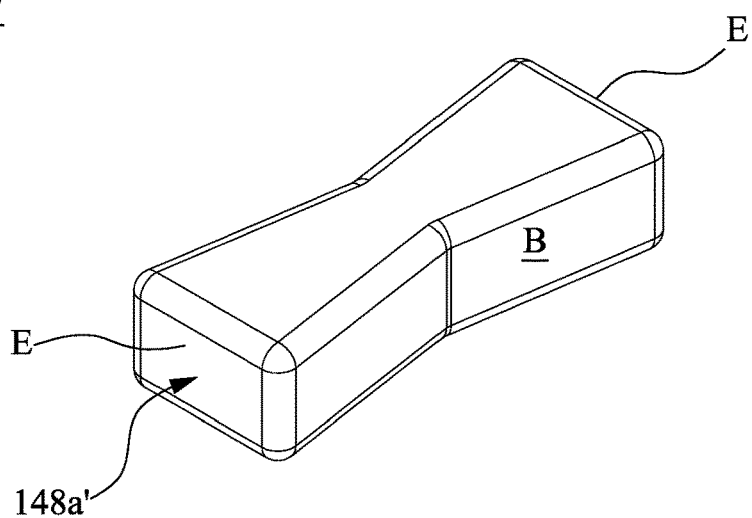
FIG. 7B is a schematic drawing of an isolated conductive micro pin after a ball mill process is performed on the isolated conductive micro pin of FIG. 7A in accordance with some embodiments of the present disclosure.

FIG. 7B is a schematic drawing of an isolated conductive micro pin 148' after a ball mill process is performed on the isolated conductive micro pin 148 of FIG. 7A in accordance with some embodiments of the present disclosure. As shown in FIG. 7B, the body B of the micro pin 148' has two ends E, and each of the ends E has a substantially quadrangular surface 148a'. In some embodiments, the substantially quadrangular surface 148a' is a substantially rectangular surface. In some embodiments, the substantially quadrangular surface 148a' is a substantially square surface.

According to some embodiments, a method of manufacturing micro pins includes forming a release layer over a substrate. A pattern layer is formed over the release layer, in which the pattern layer has a plurality of openings spaced apart to each other and through the pattern layer. A plurality of micro pins are respectively formed in the openings. The pattern layer and the release layer are removed to obtain the micro pins.

According to some embodiments, a method of manufacturing micro pins includes providing a pattern layer, the pattern layer having a plurality of openings spaced apart to each other. A plurality of micro pins are respectively in the openings. The pattern layer is removed to obtain the micro pins.

According to some embodiments, an isolated conductive micro pin for connecting one or more components includes a body with a fixed or substantially fixed thickness, the body having at least two ends, in which each of the ends has a quadrangular or substantially quadrangular surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing micro pins, the method comprising:
    forming a release layer over a substrate;
    forming a pattern layer over the release layer, wherein the pattern layer has a plurality of openings spaced apart from each other and through the pattern layer;
    forming a plurality of micro pins respectively in the openings;
    removing the pattern layer and the release layer to obtain the micro pins; and
    after removing the pattern layer and the release layer, rounding corners of the micro pins, wherein rounding the corners of the micro pins includes performing a ball mill process on the micro pins.

2. The method of claim 1, wherein the release layer comprises a material selected from the group consisting of: Au, Cu, Al, Pt, Ti, Cr, and a combination thereof.

3. The method of claim 1, wherein the release layer comprises a material selected from the group consisting of: Au, Cu, Al, Pt, Ti and Au, Cr and Au, Ti and Cu, Cr and Cu, Ti and Al, Cr and Al, Ti and Pt, and Cr and Pt.

4. The method of claim 1, wherein the release layer comprises: an adhesion layer; and a conductive layer, and wherein forming the release layer over the substrate comprises:
forming the adhesion layer over the substrate; and
forming the conductive layer over the adhesion layer.

5. The method of claim 4, wherein removing the pattern layer and the release layer comprises:
removing the pattern layer;
removing the adhesion layer to separate the conductive layer and the micro pins over the conductive layer from the substrate; and
removing the conductive layer to obtain the micro pins.

6. The method of claim 4, wherein the adhesion layer comprises a material selected from the group consisting of: Cr, Ti, and a combination thereof.

7. The method of claim 4, wherein the conductive layer comprises a material selected from the group consisting of: Au, Cu, Al, Pt, and a combination thereof.

8. The method of claim 4, wherein each of the micro pins comprises a metallic element different from a metallic element of the conductive layer and a metallic element of the adhesion layer.

9. The method of claim 4, wherein the adhesion layer and the conductive layer exclude copper.

10. The method of claim 1, wherein forming the micro pins respectively in the openings is conducted by performing an electroplating process.

11. The method of claim 1, wherein forming the pattern layer over the release layer comprises performing a photolithography process.

12. A method of manufacturing micro pins, the method comprising:
providing a pattern layer, the pattern layer having a plurality of blind holes spaced apart from each other;
forming a plurality of micro pins respectively in the blind holes;
removing the pattern layer to obtain the micro pins; and
after removing the pattern layer, rounding corners of the micro pins, wherein rounding the corners of the micro pins includes performing a ball mill process on the micro pins.

13. The method of claim 12, wherein the pattern layer is conductive.

14. The method of claim 12, wherein the pattern layer comprises a material selected from the group consisting of: Au, Cu, Al, Pt, or a combination thereof.

15. The method of claim 12, wherein each of the micro pins comprises a metallic element different from a metallic element of the pattern layer.

16. The method of claim 12, further comprising forming a conductive layer on a bottom surface of the blind holes.

17. A method of manufacturing micro pins, the method comprising:
forming an electrode over a substrate;
forming a pattern layer over the electrode, wherein the pattern layer has a plurality of openings spaced apart from each other to expose a plurality of portions of the electrode;
forming a plurality of micro pins respectively in the openings;
removing the pattern layer and the electrode to obtain the micro pins; and
after removing the pattern layer and the electrode, rounding corners of the micro pins, wherein rounding the corners of the micro pins includes performing a ball mill process on the micro pins.

18. The method of claim 16, wherein forming the micro pins includes performing an electroplating process on the conductive layer.

19. The method of claim 17, wherein forming the micro pins includes performing an electroplating process on the electrode.

20. The method of claim 17, wherein forming the pattern layer includes performing a printing process to form a printed pattern layer.

* * * * *